(12) United States Patent
Marutsuka

(10) Patent No.: US 6,188,174 B1
(45) Date of Patent: Feb. 13, 2001

(54) ELECTROMAGNETIC RADIATION SHIELD PANEL AND METHOD OF PRODUCING THE SAME

(75) Inventor: Toshinori Marutsuka, Tokyo (JP)

(73) Assignee: Nisshinbo Insustries, Inc., Tokyo (JP)

( * ) Notice: Under 35 U.S.C. 154(b), the term of this patent shall be extended for 0 days.

(21) Appl. No.: 08/927,050

(22) Filed: Sep. 10, 1997

(30) Foreign Application Priority Data

Oct. 1, 1996 (JP) .................................................. 8-278563

(51) Int. Cl.$^7$ .............................. H01J 31/00; B05D 3/04; B05D 1/36; B32B 17/10
(52) U.S. Cl. ..................... 313/479; 313/313; 427/306; 427/403; 428/209; 428/441; 428/457; 428/461; 428/515
(58) Field of Search ..................... 428/441, 457, 428/461, 469, 473.5, 515, 209; 315/85; 427/306, 403; 313/479, 313

(56) References Cited

U.S. PATENT DOCUMENTS

| | | | | |
|---|---|---|---|---|
| 4,663,240 | * | 5/1987 | Hajdu et al. ........................ | 428/545 |
| 4,933,110 | * | 6/1990 | Tucker ................................ | 252/582 |
| 5,076,841 | | 12/1991 | Chen et al. ......................... | 106/1.25 |
| 5,082,734 | * | 1/1992 | Vaughn .............................. | 428/411.1 |
| 5,811,923 | * | 9/1998 | Zieba et al. ......................... | 313/479 |
| 5,844,037 | * | 12/1998 | Lundgard et al. ................... | 524/496 |
| 5,946,062 | * | 8/1999 | Hasegawa et al. .................... | 349/58 |

FOREIGN PATENT DOCUMENTS 0 761 842  3/1997 (EP) .
5-16281  1/1993 (JP) .

OTHER PUBLICATIONS

*Patent Abstracts of Japan*, 14(55) (E–0882), abstract of JP 1–278800 (Nov. 1989).
*Patent Abstracts of Japan*, 15(29) (E–1026), abstract of JP 2–271697 (Nov. 1990).
*Patent Abstracts of Japan*, 17(286) (M–1422), abstract of JP 5–016281 (Jan. 1993).
*Patent Abstracts of Japan*, 16(178) (E–1196), abstract of JP 4–022045 (Jan. 1992).
*Patent Abstracts of Japan*, 96(6), abstract of JP 8–055581 (Feb. 1996).
*Patent Abstracts of Japan*, 16(123), abstract of JP 3–290687 (Dec. 1991).

* cited by examiner

Primary Examiner—Paul Thibodeau
Assistant Examiner—Holly C Rickman
(74) Attorney, Agent, or Firm—Wenderoth, Lind & Ponack, L.L.P.

(57) ABSTRACT

A transparent electromagnetic radiation shield panel suitable for placement in front of a TV display device, particularly a large plasma display panel, or other such source of electromagnetic radiation to shield the viewer from electromagnetic radiation is provided, which transparent electromagnetic radiation shield material comprises a transparent electromagnetic radiation shield film, a transparent adhesive layer provided on an electromagnetic radiation shield layer of the film, and a display panel having the transparent electromagnetic radiation shield film laminated thereto via the transparent adhesive layer. A method of producing the electromagnetic radiation shield panel comprises the steps of forming a transparent resin coating including a plating catalyst on one surface of a transparent film, forming a layer of plated metal on the coated surface by electroless plating while simultaneously blackening the coating, forming a desired resist pattern on the layer of plated metal, removing portions of the layer of plated metal where no resist is present and blackened portions of the coating thereunder by selective etching, thereby obtaining an electromagner radiation shied film, providing a transparent adhesive layer on the film, and laminating the film to a display panel or a transparent substrate by the adhesive layer.

12 Claims, No Drawings

ELECTROMAGNETIC RADIATION SHIELD PANEL AND METHOD OF PRODUCING THE SAME

BACKGROUND OF THE INVENTION

1. Field of the Invention

This invention relates to a transparent electromagnetic radiation shield panel, more particularly to a transparent electromagnetic radiation shield panel for placement in front of a TV display device or other such source of electromagnetic radiation to shield the viewer from electromagnetic radiation, and to a method of producing the same. The electromagnetic radiation shield panel according the invention is especially suitable for use with a large plasma display panel.

2. Description of the Background Art

An electromagnetic radiation shield material for placement in front of a display device or other source of electromagnetic radiation is required to have excellent visibility and transparency and a wide viewing angle in addition to excellent electromagnetic radiation shielding capability. Japanese Patent Application Laid-Open No. 5-16281 (JP5-16281) teaches an electromagnetic radiation shield material meeting these requirements.

According to the disclosed invention, a transparent plastic sheet is coated with cellulose acetate propionate to form a hydrophilic transparent resin layer thereon. After being air-dried, the coated sheet is soaked in hydrochloric acid palladium colloid catalyst solution to form electroless plating nuclei in the hydrophilic transparent resin, washed with water and subjected to electroless copper plating. The electroless plating is then patterned by etching by the resist method using ferric chloride. The surface of the electroless plating exhibits metallic luster while the hydrophilic transparent resin layer under the patterned electroless plating exhibits black patterning.

This prior-art invention (JP5-16281), however, requires the hydrophilic transparent resin to be formed with electroless plating nucleus catalyst by soaking in hydrochloric acid palladium colloid catalyst solution before the electroless plating step.

Since electroless plating nuclei are adsorbed on both surfaces of the substrate and both surfaces are plated by this method, however, the plating cost is high. An attempt to reduce the plating cost by plating only the coated surface is ineffective, however, since it requires the opposite surface to be treated to prevent plating, which increases the number of processing steps and increases production cost. Another problem with the method is that the soaking of the substrate in the catalyst solution markedly degrades adhesion between the-coating and the substrate.

Moreover, since the impregnation of the coating with catalyst is effected by soaking the substrate in a catalyst solution, uniform catalyst distribution in the thickness direction of the coating is hard to achieve. The blackening of the coating by plating is therefore difficult to conduct stably and efficiently. The method is also poor in product yield because defects tend to arise during patterning of the plating owing to the unevenness of the plating adhesion.

In addition, the popularity of large television sets with plasma displays has increased rapidly in recent years. When the prior-art electromagnetic radiation shield material is used in panels for the large plasma displays of such TVs, the cutting etc. of panels of different sizes from the material cannot be conducted so as to avoid defective portions since the electromagnetic radiation shielding layer is formed directly on a transparent substrate of a size matched to the plasma display. Therefore, if the panel includes a defect, even though at only one place and no matter how small relative to the total surface area, the whole panel must be discarded as defective. This lowers the product yield.

SUMMARY OF THE INVENTION

The present invention overcomes this problem to enable high-yield, economical production of electromagnetic radiation shield panels by cutting sheets of different sizes from a continuous web (roll) of transparent electromagnetic radiation shield film while avoiding inclusion of defective portions in the sheets and laminating the cut sheets to display panels and/or transparent substrates. Since the roll film can be produced by a continuous process, its productivity is higher than unit substrates. Owing to its flexibility, moreover, the film can also be used to produce curved shield panels.

Specifically, this invention provides an electromagnetic radiation shield panel comprising a transparent electromagnetic radiation shield film, a transparent adhesive layer on the transparent electromagnetic radiation shield film and a display panel or a transparent substrate having the transparent electromagnetic radiation shield film laminated thereto by the transparent adhesive layer.

DETAILED DESCRIPTION OF THE PREFERRED EMBODIMENTS

The transparent electromagnetic radiation shield film of the electromagnetic radiation shield panel of this invention can be produced by the method invented earlier by the same inventor and taught by the same assignee's Japanese Patent Application No. 8-191677.

This method comprises using a transparent film as the base material, forming a transparent resin coating including a plating catalyst on at least one surface of the transparent film, forming a layer of plated metal (electromagnetic radiation shielding) on the coated surface by electroless plating while simultaneously blackening the coating, forming a desired resist pattern on the electroless plating layer, and removing portions of the layer of plated metal where no resist is present and blackened portions of the coating thereunder by selective etching.

The transparent film is preferably one constituted as a continuous web that can be continuously processed into a roll. Such films include plastic films having a thickness in the approximate range of 5–300 μm made of polyethylene terephthalate (PET), polyimide (PI), polyethersulfone (PES), polyether-etherketone (PEEK), polycarbonate (PC), polypropylene (PP), polyamide, acrylic resin, cellulose propionate (CP), and cellulose acetate (CA).

A plasma display produces a relatively large amount of heat and also emits infrared rays that may cause nearby infrared ray devices to malfunction. When the electromagnetic radiation shield panel is used in a plasma display panel, therefore, an infrared ray cut film is preferably used as the transparent film.

The resin contained in the resin solution for coating the base material may be of any type insofar as it exhibits the required transparency as well as good solubility or good dispersibility in metallic salt or metal complex to become the plating catalyst after reduction or reduced metal particles.

For impregnation of the resin with the plating solution so that the reduced metal particles (plating catalyst) form nuclei and react to cause blackening by deposition of the plating metal, the resin used is preferably a hydrophilic transparent resin. Preferable hydrophilic transparent resins include vinyl acetal resins, vinyl alcohol resins, acrylic resins, cellulose resins and the like. Among these, vinyl acetal resins such as polyvinyl butyral and cellulose resins such as cellulose acetate butylate are particularly preferred.

The thickness of the dried coating is preferably about 0.5–5 $\mu$m. When the coating is too thin, blackening of the coating during electroless plating is insufficient and the visibility, an extremely important factor in television applications, is degraded. The problem with an excessively thick coating is difficulty of handling. The plating catalyst contained in the resin coating is reduced metal particles. The reduced metal particles can be directly incorporated in the resin coating or be incorporated therein by reducing a metallic salt or a metal complex contained in the resin coating.

The metallic salt or metal complex used in this invention is preferably an organic or inorganic metallic salt or complex, more preferably an inorganic salt or complex, easily reducible to a metal by a reducing agent (described later), exhibiting plating catalytic activity and solubility in a common solvent (described later) with the resin. Specific examples include sulfates, nitrates, chlorides, organic salts (e.g., acetates), benzonitrile complexes, acetylacetonate complexes and ammonia complexes of iron, copper, nickel, cobalt, palladium and other elements belonging to Group Ib and Group VIII of the Periodic Table of the Elements.

The reduced metal particles used in this invention are colloid particles contained in a reduced metal colloid dispersion or reduced metal powder particles obtained from the metal colloid dispersion. Insofar as they exhibit plating catalytic activity and are uniformly dispersible in the coating, they are not particularly limited as regards type of metal or grain size. They preferably have high stability with respect to air and humidity. Specific examples of usable reduced metal particles include metals belonging to Group VIII of the Periodic Table of the Elements (Ni, Co, Rh, Pd etc.), with (aqueous) reduced Pd colloid particles and reduced Pd powder obtained therefrom being particularly preferable. The reduced metal colloid particles can be produced by the methods described in Japanese Patent Application Laid-Open No. 1-315334. Specifically, a colloid dispersion can be obtained by reducing a salt of the metal in a mixed solution consisting of a lower alcohol and an aprotic polar compound.

The amount of the plating catalyst included is preferably in the range of 0.5–100 PHR (parts by weight based on 100 parts of resin), more preferably 1–50 PHR.

The coating is formed by applying a solution of the resin and metallic salt or metal complex and/or reduced metal particles to the transparent film and drying it to form a coating containing the metallic salt or metal complex and/or reduced metal particles. The application of the solution can be carried out by brush coating, spraying, dipping, roller coating, calender coating or other conventional method.

The conditions (temperature, time etc.) for film formation are determined based on the type and concentration of the resin, the film thickness and the like. The nonvolatile content of the solution is normally 0.05–20 wt %. The coating thickness is 0.2–10 $\mu$m, preferably 0.5–5 $\mu$m.

The reduction is generally conducted after final curing but can also be conducted in the course of curing. The treatment with the reducing agent causes the metallic salt or metal complex in the coating to deposit as reduced metal within or at the surface of the coating. The metal deposited at the surface partially projects from the surface to form a reduced metal (plating catalyst) layer partially embedded in and integral with the coating.

Preferable reducing agents include sodium borohydride, lithium borohydride, aminoborane, dimethyla-minoborane and other borohydrides, ferrous salts such as $FeSO_4$, hydrogenphosphate metallic salts such as sodium hypophosphite, hydroxylamine sulfate and hydrosulfite, and the like. A borohydride is generally preferable.

Although the solvent used to prepare the reducing agent solution is generally water, it is not limited to water and an organic solvent or any other solvent system capable of dissolving or dispersing the reducing agent can be used instead. The concentration of the reducing agent in the reducing agent solution is generally 0.05–50 wt %, preferably 0.1–25 wt %.

The reduction can be easily conducted by, for example, immersing the substrate bearing the coating containing the metallic salt or metal complex in the reducing agent solution for an appropriate period of time or spraying it with the reducing agent solution.

The reduction temperature is preferably about 10–90° C. and the period of contact with the reducing agent solution is preferably on the order of several tens of seconds to 30 minutes.

The solvent can be completely removed from the coating before the reduction or part of the solvent may be allowed to remain therein. Leaving part of the solvent in the coating facilitates permeation of the reducing agent into the coating.

When the solvent is completely removed from the coating, the reduction efficiency can be increased by such methods as increasing the temperature of the reducing agent solution, preheating the coating before reduction, treating the coating with a solution that causes it to swell, or using a reducing agent solution whose solvent is similar to and exhibits good affinity for the resin solvent.

The reduction is ordinarily conducted until at least the metallic salt or metal complex present in the surface layer has been reduced but can instead be terminated earlier.

When reduced metal particles are used independently, they can, as required, be treated with a reducing agent or with an acid or an alkali in order to enhance the degree of catalytic activity.

In this invention, the amount of the reduced metal in the coating accounted for by Pd, for example, is preferably 1–200 mg/$^2$ (weight per unit area of the coating) calculated as $PdCl_2$. When the amount is less than 1 mg/m$^2$, sufficient blackening is difficult to obtain, while an amount greater than 200 mg/m$^2$ is uneconomical.

The base material prepared for plating (implanted with catalyst) is transferred to the electroless plating process and subjected to desired metal plating. The electroless plating can be conducted by a conventional method selected based on intended purpose. Ni plating and Cu plating are typical examples.

In the method of this invention, the adhesion, hardness, strength, plating catalytic activity and the like of the coating prepared for plating can be adjusted by appropriately selecting the type of resin, metallic salt or metal complex and/or reduced metal particles and by varying such operating conditions as the curing and reducing agent treatment conditions.

The coating prepared for plating is next treated with an electroless plating solution to form an electroless plating layer. The coating is blackened simultaneously with the formation of the electroless plating layer. After this treatment, therefore, the portion overlaid with the electroless plating layer appears black when viewed from the side of the transparent film.

Next, a resist pattern matched to electrically conductive portions of the electromagnetic radiation shield film is formed on the electroless plating layer. The resist pattern can be formed by a generally known method such as printing or photolithography.

Unnecessary portions of the electroless plating layer where no resist is present and unnecessary black portions are then removed by treatment with an etching solution.

As a result, the coating is formed under the patterned electroless plating layer with black portions of the same pattern. The portions where the electroless plating layer and the black portions have been removed is transparent. The resist portions are then removed by an appropriate method to enable easy electrical contact with the electroless plating.

The foregoing processes enable the fabrication of a transparent electromagnetic radiation shield film having conductive portions formed in a desired pattern.

As viewed from the transparent film side of the electromagnetic radiation shield film, the coating preferably has a degree of blackness, expressed as optical density, of 2.9–4.0 (angle of incidence of 7°; assuming no specular component). When the optical density is less than 2.9, visibility is poor owing to the low blackness of the coating. (The intensity of plating glare increases with decreasing optical density.) When the optical density is 2.9 or greater, the blackness of the coating is adequate and visibility excellent (definition high).

The etching solution is selected as appropriate for the type of metal of the electroless plating layer. When the electroless plating layer metal is nickel or copper, for example, aqueous solution of ferric chloride and hydrochloric acid or the like can be used as the etching solution.

The pattern of the conductive portion of the electromagnetic radiation shield film need not necessarily be formed by etching treatment. Any of various other methods can be used instead. One such method is to form a catalyst-containing resin coating on the transparent film in the desired conductive portion pattern and then conduct electroless plating. This method eliminates the need for etching treatment and has the further advantage of lowering cost by reducing the amount of coating resin and catalyst required.

The layer of plated metal formed on the electromagnetic radiation shield film in the foregoing manner constitutes an electromagnetic radiation shield layer.

A transparent adhesive layer is formed on the surface of the shield layer. The transparent electromagnetic radiation shield film is used as laminated to a display panel by the adhesive layer. Commercially available resin-base adhesives, including those of acrylic and/or silicon type, can be used as the transparent adhesive. The thickness of the adhesive layer is generally not less than 2 $\mu$m, preferably about 5–500 $\mu$m.

Among different types of display panels, the plasma display panel has recently come into increasing use. As pointed out in the foregoing, the electromagnetic radiation shield panel of this invention can be advantageously applied to the plasma display panel. It can be directly attached to the display panel or, instead, be laminated to a transparent plate such as a glass or plastic plate and the resulting laminate be attached to or fitted on the display panel.

The plastic plate is preferably a resin with high transparency. Preferable examples include acrylic resins, polycarbonate, polyethylene, AS resins, vinyl acetate resin, polystyrene, polypropylene, polyester, polysulfone, polyethersulfone, polyvinylchloride, olefine-maleimide copolymer, and norbornene resins. Among these, olefine-maleimide copolymer and norbornene resins are particularly preferable owing to their high heat resistance.

The plastic should preferably have a thermal-deformation temperature of 140–360° C., a coefficient of thermal linear expansion of not greater than $6.2 \times 10^{-5}$ cm/cm·° C., a pencil hardness of not less than 2H, a bending strength of 1,200–2,000 kgf/cm$^2$, a modulus of elasticity in bending of 30,000–50,000 kgf/cm$^2$, and a tensile strength of 700–1,200 kgf/cm$^2$. A plastic with these properties is resistant to scratching and high-temperature warping, and can therefore be used in a wide range of environments.

The plastic preferably has a light transmittance of not less than 90%, an Abbe's number of 50–70 and a photoelasticity constant (glass region) of an absolute value of not greater than $10 \times 10^{-13}$ cm$^2$/dyne. A plastic plate with these properties exhibits high transparency (is bright) and little birefringence (is not likely to produce a double image), and therefore does not degrade the image quality, brightness etc. of the display.

The electromagnetic radiation shield panels obtained according to the invention had an optical transmittance of 65–75% (transmittance at a wavelength of 550 nm measured with a spectrochemical analyzer) and a shielding performance of 40–80 dB in the range of 30 to 1,000 MHz (electric field shielding effect measured with a TR-17301 electromagnetic radiation shielding effect measuring instrument manufactured by Advantest Corporation). These performances are fully adequate for practical applications.

EXAMPLE 1

A coating solution was prepared by mixing an alcohol solution of polyvinylbutyral (PVB) (Denkabutyral #6000-C, product of Denki Kagaku Kogyo, Co., Ltd.) and an aqueous palladium (Pd) colloidal catalyst solution (OPC-80 Catalyst M, product of Okuno Chemical Industries Co., Ltd.). (Coating solution composition: PVB/catalyst solution/methanol/butanol=30/129/541/300 (weight ratio), Pd colloid=3 PHR (as PdCl$_2$))

The coating solution was applied to a polyethylene terephthalate (PET) film (B4-size) by dip coating and dried for 3 hr at 80° C. The coating thickness was 1 $\mu$m.

The coated (catalyst-containing) product was directly immersed for 1 hr in a 25° C. Cu plating solution (OPC-700M, product of Okuno Chemical Industries Co, Ltd.). As a result, the surface of the coating on the PET film exhibited a copper luster and the coating (as viewed from the film side) exhibited a deep black color.

The Cu plated product was coated with a positive etching photoresist (PMER P-DF40S, product of Tokyo Ohka Kogyo Co., Ltd.), prebaked (thickness: 5 $\mu$m), exposed (using a grid-like pattern mask), and developed to form a grid-like resist pattern. These processes were conducted under the conditions recommended by the manufacturer.

The resist-patterned product was immersed in etching solution (aqueous solution of ferric chloride and hydrochloric acid) to remove the copper plating and the blackened copper within the coating by etching, while leaving the coating. The resist was then peeled off to produce a conductive pattern (transparent electromagnetic radiation shield film).

A transparent acrylic adhesive layer (10 μm) was formed on the film side of the electromagnetic radiation shield film and the electromagnetic radiation shield film was laminated to a glass plate (thickness: 4 mm) by the adhesive layer to fabricate a transparent electromagnetic radiation shield panel.

The electromagnetic radiation shield panel exhibited excellent shielding performance (40–80 dB, 30–1000 MHz) and transparency (optical transmittance of 75%), visibility, and coating adherence (to base material), and plating adherence (to coating).

EXAMPLE 2

The transparent electromagnetic radiation shield film of Example 1 was applied on its plated metal layer side with a transparent adhesive layer as in Example 1 and thereafter laminated to a plasma display panel (PDP) by the adhesive layer to fabricate a transparent electromagnetic radiation shield panel. The electromagnetic radiation shield panel exhibited excellent performance characteristics similar to those of that obtained in Example 1.

EXAMPLE 3

A transparent electromagnetic radiation shield film was produced in the manner of Example 1 except that the PET film of Example 1 was replaced with a triacetyl cellulose (TAC) film laminate obtained by laminating a protective film to TAC film via a transparent acrylic adhesive layer.

The protective film was peeled off the electromagnetic radiation shield film and laminated to an acrylic resin plate to fabricate a transparent electromagnetic radiation shield panel. The electromagnetic radiation shield panel exhibited excellent performance characteristics similar to those of that obtained in Example 1.

EXAMPLE 4

A transparent electromagnetic radiation shield film was produced in the manner of Example 1 except that the PET film of Example 1 was replaced with a near infrared (NIR) cut film.

The electromagnetic radiation shield film (the plated metal layer side thereof) was laminated to a glass plate formed with a transparent acrylic adhesive layer to fabricate a transparent electromagnetic radiation shield panel. The electromagnetic radiation shield panel exhibited excellent performance characteristics similar to those of that obtained in Example 1.

EXAMPLES 5 and 6

Electromagnetic radiation shield panels were fabricated as in Example 1 except that the transparent glass plate of Example 1 was replaced with transparent heat-resistant plastic plates made of olefine-maleimide copolymer (TI-160, product of Tosoh Corporation) and norbornene resin (Arton, product of Japan Synthetic Rubber Co., Ltd.).

The electromagnetic radiation shield panels exhibited excellent performance characteristics similar to those of that obtained in Example 1. They were superior to the electromagnetic radiation shield panel of Example 1 in base material flatness (noticeably less warp for a base material of the same thickness and area).

When an electromagnetic radiation shield panel utilizing a plastic base material low in heat resistance and rigidity is disposed in front of a (plasma) display, pronounced warping of the base material owing to heat from the display frequently causes the display to crack or produce Moire fringes. The electromagnetic radiation shield materials obtained in this Example were totally free of these problems.

The performance of the electromagnetic radiation shield panels of Examples 1–6 were evaluated. The results are shown in Table 1.

TABLE 1

| Example | Film | Transparent adhesive | Display or transparent substrate | Shielding performance (dB) | Transparency (optical transmittance %) | Visibility | Coating adherence | Plating adherence |
|---|---|---|---|---|---|---|---|---|
| 1 | PET film | Acrylic | Glass plate | 40–80 | 75 | Good | Good | Good |
| 2 | PET film | Acrylic | PDP | 40–80 | 75 | Good | Good | Good |
| 3 | TAC film | Acrylic | Acrylic resin plate | 40–80 | 75 | Good | Good | Good |
| 4 | NIR cut film | Acrylic | Glass plate | 40–80 | 73 | Good | Good | Good |
| 5 | PET | Acrylic | Olefine-maleimide copolymer plate | 40–80 | 75 | Good | Good | Good |
| 6 | PET | Acrylic | Norbornene resin plate | 40–80 | 75 | Good | Good | Good |

The present invention provides the following advantageous effects:

(1) Owing to use of the electromagnetic radiation shield film invented earlier by the inventor, the electromagnetic radiation shield panel according to this invention exhibits a very high shielding performance of 40–80 dB. When an electromagnetic radiation shield film with a conductive layer formed by sputtering is used, for example, only a low shielding performance of about 3–30 dB can be obtained at an optical transmittance of around 75%.

(2) The optical transmittance is a high 65–75%.

(3) Visibility is outstanding since the base material side of the plating metal pattern of the invention electromagnetic radiation shield film is black.

(4) The structural principle makes the viewing angle wider than in the case of an electromagnetic radiation shield material utilizing a metallic mesh, a plated screen or the like.

(5) Product yield is high because electromagnetic radiation shield panels are produced by cutting sheets of different sizes from a continuous web (roll) of transparent electromagnetic radiation shield film while avoiding inclusion of defective portions in the sheets and laminating the cut sheets to display panels and/or transparent substrates.

(6) Curved shields can be produced.

The invention thus provides numerous outstanding effects.

What is claimed is:

1. An electromagnetic radiation shield panel comprising an electromagnetic radiation shield film, a transparent adhesive layer on the electromagnetic radiation shield film and a display panel or a transparent substrate, the electromagnetic radiation shield film being laminated to the display panel or the transparent substrate by the transparent adhesive layer, and the electromagnetic radiation shield panel being produced by the steps comprising:

forming a transparent resin coating including a plating catalyst on at least one surface of a transparent film, forming a layer of plated metal on the coated surface by electroless plating while simultaneously blackening the coating, forming a desired resist pattern on the layer of plated metal, removing portions of the layer of plated metal where no resist is present and blackened portions of the coating thereunder by selective etching, thereby obtaining an electromagnetic radiation shield film, providing a transparent adhesive layer on the film, and laminating the film to a display panel or a transparent substrate by the adhesive layer.

2. The electromagnetic radiation shield panel according to claim 1, wherein the electromagnetic radiation shield film shields the entire surface of the display panel by covering the display panel surface with a transparent adhesive layer.

3. The electromagnetic radiation shield panel according to claim 1, wherein:

the electromagnetic radiation shield film is obtained by forming a transparent resin coating including a plating catalyst on at least one surface of a transparent film, forming a layer of plated metal as electromagnetic radiation shielding on the coated surface by electroless plating while simultaneously blackening the coating, forming a desired resist pattern on the layer of plated metal, and removing portions of the layer of plated metal where no resist is present and blackened portions of the coating thereunder by selective etching to form a selectively etched surface which is adhered to said display panel by said adhesive.

4. The electromagnetic radiation shield panel according to claim 1, wherein the transparent adhesive is acrylic resin.

5. The electromagnetic radiation shield panel according to claim 1, wherein the display panel is a plasma display panel.

6. An electromagnetic radiation shield panel according to claim 1, wherein the transparent substrate is a glass plate or a plastic plate.

7. An electromagnetic radiation shield panel according to claim 6, wherein the plastic plate is a plate of olefine-maleimide copolymer or norbornene resin.

8. The electromagnetic radiation shield panel according to claim 3, wherein the transparent resin coating is formed of polyvinyl acetal resin and has a thickness of 0.5–5 μm.

9. The electromagnetic radiation shield panel according to claim 3, wherein the layer of plated metal is formed by electroless plating of copper.

10. A method of producing an electromagnetic radiation shield panel in accordance with claim 1 comprising the steps of:

forming a transparent resin coating including a plating catalyst on at least one surface of a transparent film, forming a layer of plated metal on the coated surface by electroless plating while simultaneously blackening the coating, forming a desired resist pattern on the layer of plated metal, removing portions of the layer of plated metal where no resist is present and blackened portions of the coating thereunder by selective etching, thereby obtaining an electromagnetic radiation shield film, providing a transparent adhesive layer on the film, and laminating the film to a display panel or a transparent substrate by the adhesive layer.

11. The electromagnetic radiation shield panel according to claim 1, wherein the coating has a degree of blackness viewed from the transparent film side of the electromagnetic radiation shield film, expressed as optical density, of 2.9–4.0 (angle of incidence of 7°; assuming no specular component).

12. The electromagnetic radiation shield panel according to claim 1, wherein the electromagnetic radiation shield panel exhibits an optical transmittance of 65–75% and a shielding performance of 40–80 dB in the range of 30 to 1,000 MHz.

* * * * *